(12) United States Patent
Suzuki

(10) Patent No.: US 12,325,595 B2
(45) Date of Patent: Jun. 10, 2025

(54) ARTICLE TRANSPORT FACILITY

(71) Applicant: Daifuku Co., Ltd., Osaka (JP)

(72) Inventor: Shigetaka Suzuki, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 113 days.

(21) Appl. No.: 18/381,015

(22) Filed: Oct. 17, 2023

(65) Prior Publication Data

US 2024/0132294 A1 Apr. 25, 2024
US 2024/0228177 A9 Jul. 11, 2024

(30) Foreign Application Priority Data

Oct. 19, 2022 (JP) ................................. 2022-167768

(51) Int. Cl.
*B65G 35/06* (2006.01)
*B65G 43/00* (2006.01)

(52) U.S. Cl.
CPC ............ *B65G 35/06* (2013.01); *B65G 43/00* (2013.01)

(58) Field of Classification Search
CPC ..... H04W 36/08; H04W 36/18; H04W 24/02; H04W 36/32; H01L 21/67727; B65G 17/12; B65G 43/00; B65G 35/06
USPC .......................................................... 198/460.1
See application file for complete search history.

(56) References Cited

U.S. PATENT DOCUMENTS 12,177,728 B2 * 12/2024 Sharma ................. H04W 36/28
2024/0383689 A1 * 11/2024 Kimura ................. H04W 84/12

FOREIGN PATENT DOCUMENTS

| DE | 112017006419 T5 | * | 8/2019 |
| EP | 3476155 | * | 7/2022 |
| JP | 201836867 A | | 3/2018 |
| KR | 20200015506 | * | 2/2020 |

* cited by examiner

*Primary Examiner* — Gene O Crawford
*Assistant Examiner* — Lester Rushin, III
(74) *Attorney, Agent, or Firm* — The Webb Law Firm

(57) ABSTRACT

During a switch from a first state in which a transport vehicle is connected to a first access point in a first access point group to a second state in which the transport vehicle is connected to a second access point in a second access point group, or a switch from the second state to the first state, an upper-level controller executes network segment switching processing including restarting a communication controller and a protocol stack, while maintaining a physical layer device in an active state.

2 Claims, 2 Drawing Sheets

ARTICLE TRANSPORT FACILITY

CROSS-REFERENCE TO RELATED APPLICATION

This application claims priority to Japanese Patent Application No. 2022-167768 filed Oct. 19, 2022, the disclosure of which is hereby incorporated by reference in its entirety.

BACKGROUND OF THE INVENTION

1. Field of the Invention

The present invention relates to an article transport facility including a transport vehicle that travels along a predetermined travel route to transport an article, a control device that controls the transport vehicle, and a communication facility that communicably connects the transport vehicle and the control device.

2. Description of Related Art

An example of such an article transport facility is disclosed in JP 2018-36867A (Patent Document 1). Hereinafter, in "Description of the Related Art", the reference numerals in Patent Document 1 are cited in parentheses. The article transport facility disclosed in Patent Document 1 includes an unmanned traveling vehicle (2) that travels along a route (1, 4) to transport an article (8), a control device (30) that controls the unmanned traveling vehicle (2), and a communication facility that communicably connects the unmanned traveling vehicle (2) and the control device (30). The communication facility includes base stations (A1, A2) arranged in such a manner as to be communicable with the unmanned traveling vehicle (2), and a LAN (10) for connecting the multiple base stations (A1, A2) to each other. The base stations (A1, A2) are configured to relay the communication between the control device (30) and the unmanned traveling vehicle (2) via communication links (L1, L2) with the unmanned traveling vehicle (2), and via the LAN (10). While the unmanned traveling vehicle (2) is traveling, roaming is made in which the base stations (A1, A2) to which the unmanned traveling vehicle (2) is to establish the communication link (L1, L2) are switched. Patent Document 1 discloses a technique for reducing the time required for the roaming.

SUMMARY OF THE INVENTION

Meanwhile, if a communication network includes a plurality of network segments, hand-over (hand-off) for switching access points (base stations in Patent Document 1) with which a communication link is to be established is made between not only access points belonging to the same network segment, as in the roaming in Patent Document 1, but also access points belonging to different network segments. In view point of the efficiency of article transport by a transport vehicle (unmanned traveling vehicle in Patent Document 1), it is also desirable to reduce the time required for such hand-over between access points belonging to different network segments, but Patent Document 1 is silent about this view point.

Therefore, there is a demand for realization of a technique that can reduce the time required for hand-over between access points belonging to different network segments, suppressing a decrease in article transport efficiency due to the hand-over.

According to the present disclosure, an article transport facility includes: a transport vehicle configured to travel along a predetermined travel route to transport an article; a control device configured to control the transport vehicle; and a communication facility configured to communicably connect the transport vehicle and the control device, wherein the communication facility includes: a plurality of access points for wireless communication installed in such a manner as to be communicable with the transport vehicle; and a communication network configured to connect the plurality of access points to each other, with a first access point group being a group of first access points among the plurality of access points, and a second access point group being a group of second access points different from the first access points, the communication network includes: a first network segment configured to connect the first access points constituting the first access point group to each other; and a second network segment configured to connect the second access points constituting the second access point group to each other, the transport vehicle includes: a wireless communication apparatus; and a communication unit configured to communicate via the wireless communication apparatus with an access point selected from the plurality of access points, the communication unit includes: a physical layer device configured to control a connection established with the wireless communication apparatus; a communication controller configured to control processing and communication of data transmitted and received via the physical layer device; a protocol stack including a communication protocol for communication performed via the communication network; and an upper-level controller configured to control the physical layer device, the communication controller, and the protocol stack, and during (i) a switch from a first state in which the transport vehicle is connected to a first access point in the first access point group to a second state in which the transport vehicle is connected to a second access point in the second access point group, or (ii) a switch from the second state to the first state, the upper-level controller executes network segment switching processing including restarting the communication controller and the protocol stack, while maintaining the physical layer device in an active state.

According to the configuration, during (i) a switch from a first state in which the transport vehicle is connected to a first access point in the first access point group (in other words, an access point belonging to the first network segment) to a second state in which the transport vehicle is connected to a second access point in the second access point group (in other words, an access point belonging to the second network segment), or (ii) a switch from the second state to the first state, the network segment switching processing is performed. That is to say, in the present configuration, the network segment switching processing is performed when hand-over is made between access points belonging to different network segments. Here, an access point with which the transport vehicle was connected before the execution of the hand-over is referred to as a "before-switching access point", and an access point to which the transport vehicle is to be connected after the execution of the hand-over is referred to as a "after-switching access point".

Also, according to the present configuration, in the network segment switching processing, the communication controller and the protocol stack are restarted while the physical layer device remains active. With this, since the communication controller and the protocol stack are restarted in the network segment switching processing, hand-over can be made appropriately. Specifically, by restarting the communication controller, it is possible to appropriately delete communication data with the before-switching access point to initialize the communication controller, and by restarting the protocol stack, it is possible to appropriately switch identification information of the transport vehicle to identification information (such as an IP address) based on which the transport vehicle can communicate with the after-switching access point. On the other hand, since the physical layer device remains active in the network segment switching processing, there is no need to perform processing for reestablishing a communication link between the physical layer device and the wireless communication apparatus (specifically, a physical layer device of the wireless communication apparatus), which is required when the physical layer device is restarted, and thus it is possible to reduce the time required for the hand-over.

Thus, according to the configuration, it is possible to reduce the time required for hand-over between access points belonging to different network segments. Also, as the time can be reduced, it is possible, even if the movement of the transport vehicle involves the hand-over between access points belonging to different network segments, to avoid an incommunicable state between the control device and the transport vehicle from continuing for a long period of time, suppressing a decrease in efficiency of article transport due to the hand-over.

Further features and advantages of the article transport facility will become apparent from the following description of an embodiment given with reference to the drawings.

BRIEF DESCRIPTION OF THE DRAWINGS

The terms Fig., FIG., Figs., FIGS., Figure, and Figures are used interchangeably to refer to the corresponding figures in the drawings

DESCRIPTION OF THE INVENTION

Figure 1:
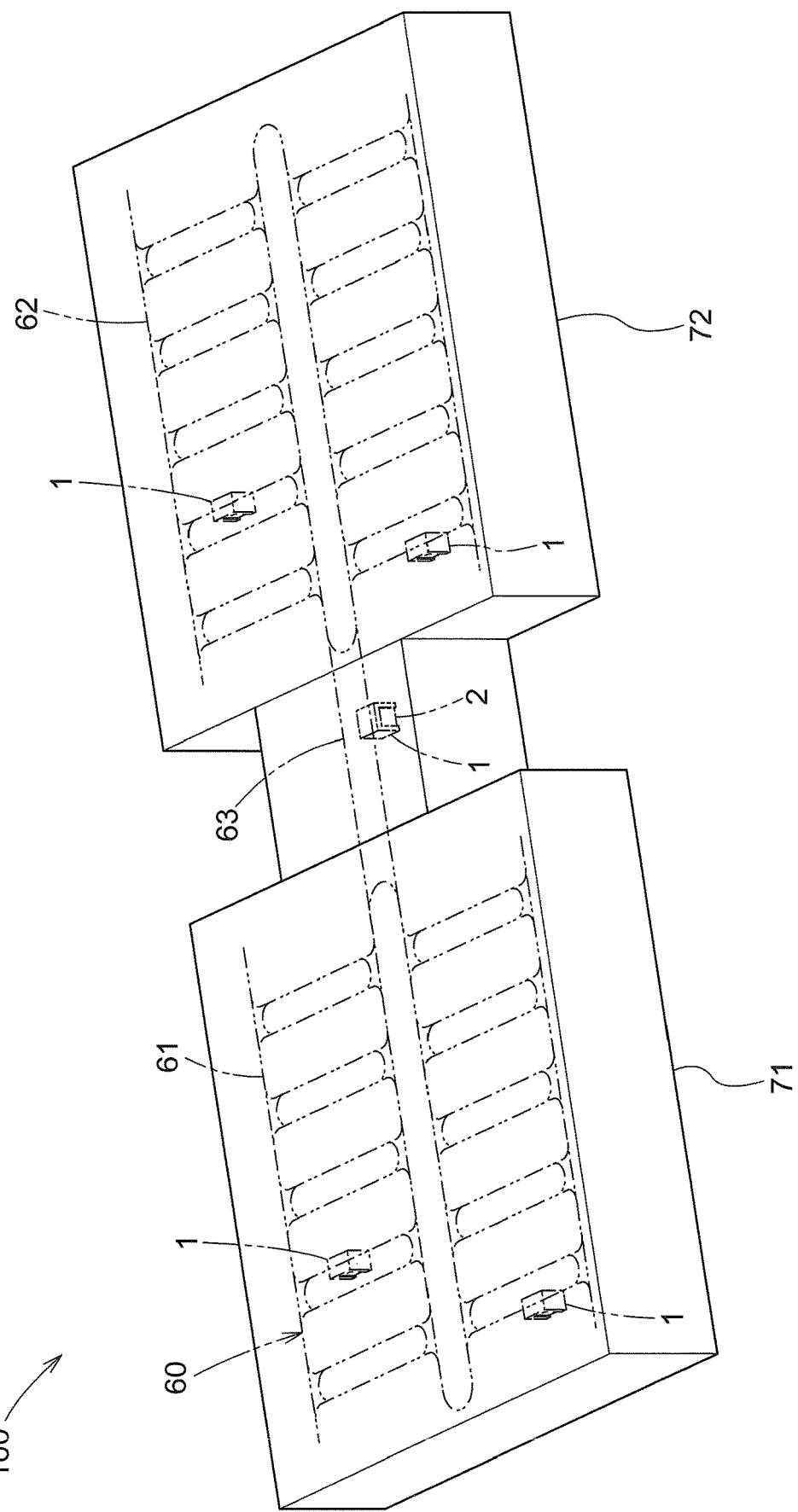
FIG. 1 is a simplified perspective view illustrating an article transport facility according to an embodiment.
Figure 2:
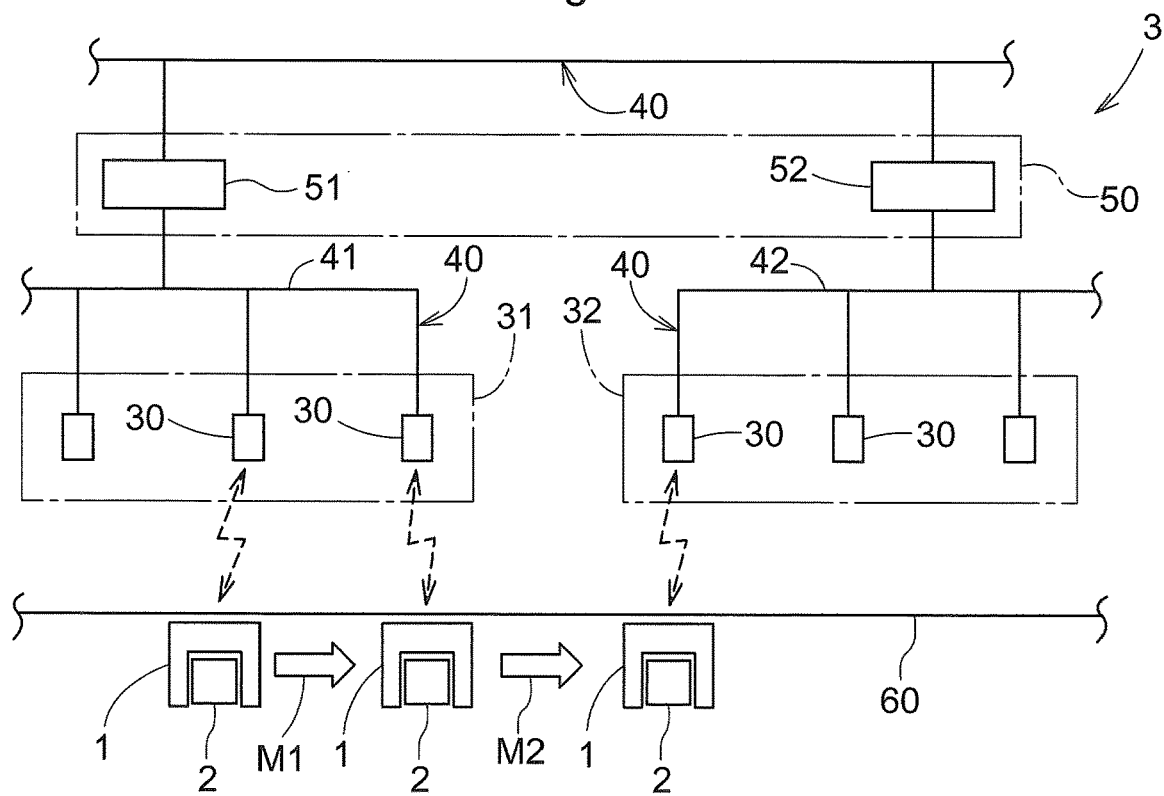
FIG. 2 is a schematic view illustrating the article transport facility according to the embodiment.

The following will describe an embodiment of an article transport facility with reference to the drawings. As shown in FIGS. 1 and 2, an article transport facility 100 includes at least one transport vehicle 1 that travels along a predetermined travel route 60 to transport an article 2, a control device 50 that controls the transport vehicle 1, and a communication facility 3 that communicably connects the transport vehicle 1 and the control device 50. In the present embodiment, the article transport facility 100 includes a plurality of transport vehicles 1, and the control device 50 controls the plurality of transport vehicles 1 via the communication facility 3. The article 2 is, for example, a FOUP (Front Opening Unified Pod) in which semiconductor wafers are stored.

The travel route 60 may be physically formed or virtually set. For example, the travel route 60 is physically formed of a rail. If the travel route 60 is formed of a rail suspended from and supported on a ceiling, the transport vehicle 1 is defined as an overhead transport vehicle that travels along the travel route 60 formed on the ceiling. The transport vehicle 1 may be an article transport vehicle other than the overhead transport vehicle. An example of the article transport vehicle other than the overhead transport vehicle can include an article transport vehicle that travels along the travel route 60 formed on a floor. In this case, the travel route 60 may be physically formed of a rail, or may be virtually set.

The control device 50 includes an arithmetic processing unit such as a CPU (Central Processing Unit), and a peripheral circuit such as a memory. The functions of the control device 50 are realized by the cooperation of these hardware units and a program that is executed on the hardware unit such as the arithmetic processing unit. The control device 50 outputs a transport instruction for instructing the transport vehicle 1 to transport the article 2. The control device 50 outputs such a transport instruction to the transport vehicle 1, for example, based on a transport schedule or in response to a transport request. The transport instruction includes information indicating a transport origin and a transport destination for the article 2. Examples of the transport origin and the transport destination for the article 2 include a load port of a processing device for processing the article 2 (or contents contained in the article 2), a storage rack for storing the article 2, and a portion of a storage apparatus for storing the article 2 at which the article 2 is loaded/unloaded (such as a pedestal or a conveyor).

In response to the transport instruction from the control device 50, the transport vehicle 1 transports the article 2 from the transport origin designated in the transport instruction to the transport destination designated in the transport instruction. At this time, a transfer operation for transferring the article 2 by the transport vehicle 1 at the transport origin and the transport destination (specifically, an operation for receiving the article 2 at the transport origin, and an operation for handing the article 2 over the transport destination), and a traveling operation of the transport vehicle 1 from the transport origin to the transport destination are controlled by a not-shown control unit provided in the transport vehicle 1. The control unit provided in the transport vehicle 1 controls driving of a driving unit such as, e.g., an electric motor so that the transport vehicle 1 performs the transfer operation or the traveling operation.

As shown in FIG. 1, the article transport facility 100 of the present embodiment is configured to perform inter-building transport in which the article 2 is transported between different buildings. Accordingly, the travel route 60 includes a first route 61 arranged in a first building 71, a second route 62 arranged in a second building 72 (different from the first building 71), and a connecting route 63 that connects the first route 61 and the second route 62. If the transport origin of the article 2 is set at one of the first building 71 and the second building 72, and the transport destination of the article 2 is set at the other one of the first building 71 and the second building 72, inter-building transport will be performed between the first building 71 and the second building 72.

As schematically shown in FIG. 2, the communication facility 3 includes a plurality of access points 30 for wireless communication installed so as to be able to communicate (specifically, wirelessly communicate) with the transport vehicle 1, and a communication network 40 that connects the plurality of access points 30 to each other. By establishing a communication link with an access point 30, the transport vehicle 1 is communicably connected to the access point 30. The control device 50 is also connected to the communication network 40, and the access point 30 relays the communication between the control device 50 and the transport vehicle 1 via the communication link with the transport vehicle 1, and the communication network 40. The communication network 40 may be a wired network, a wireless network, or a combination thereof.

As shown in FIG. 2, the communication network 40 includes a first network segment 41 and a second network segment 42. Here, a group of access points constituted by some of the plurality of access points 30 is defined as a first access point group 31, and a group of access points constituted by access points 30 different from the constituents of the first access point group 31 is defined as a second access point group 32. In other words, the second access point group 32 is an access point group constituted by a plurality of access points 30 that do not constitute the first access point group 31. The first network segment 41 connects the plurality of access points 30 constituting the first access point group 31 to each other, and the second network segment 42 connects the plurality of access points 30 constituting the second access point group 32 to each other.

In the present embodiment, although illustrations of the access points 30 and the communication network 40 are omitted in FIG. 1, the first access point group 31 is constituted by the plurality of access points 30 installed in the first building 71, and the second access point group 32 is constituted by the plurality of access points 30 installed in the second building 72. Accordingly, the transport vehicle 1 traveling on the first route 61 is connected to any one of the access points 30 constituting the first access point group 31, and the transport vehicle 1 traveling on the second route 62 is connected to any one of the access points 30 constituting the second access point group 32.

Note that the communication network 40 may include one or more network segments other than the first network segment 41 and the second network segment 42. For example, if the communication network 40 includes a third network segment other than the first network segment 41 and the second network segment 42, the third network segment will connect a plurality of access points 30 constituting a third access point group to each other. Here, the third access point group refers to an access point group constituted by a plurality of access points 30 different from both the constituents of the first access point group 31 and the constituents of the second access point group 32. In other words, the third access point group is an access point group constituted by a plurality of access points 30 that constitute neither the first access point group 31 nor the second access point group 32.

In the present embodiment, the control device 50 includes a first communication server 51 and a second communication server 52. In the example shown in FIG. 2, the first communication server 51 and the second communication server 52 are communicably connected to each other via the communication network 40.

The first network segment 41 is configured to connect the first communication server 51, and the plurality of access points 30 constituting the first access point group 31. In a first state in which the transport vehicle 1 is connected to an access point 30 in the first access point group 31 (in other words, an access point 30 belonging to the first network segment 41), the transport vehicle 1 can communicate with the control device 50 by being communicably connected to the first communication server 51.

The second network segment 42 is configured to connect the second communication server 52, and the plurality of access points 30 constituting the second access point group 32. In a second state in which the transport vehicle 1 is connected to an access point 30 in the second access point group 32 (in other words, an access point 30 belonging to the second network segment 42), the transport vehicle 1 can communicate with the control device 50 by being communicably connected to the second communication server 52.

Figure 3:
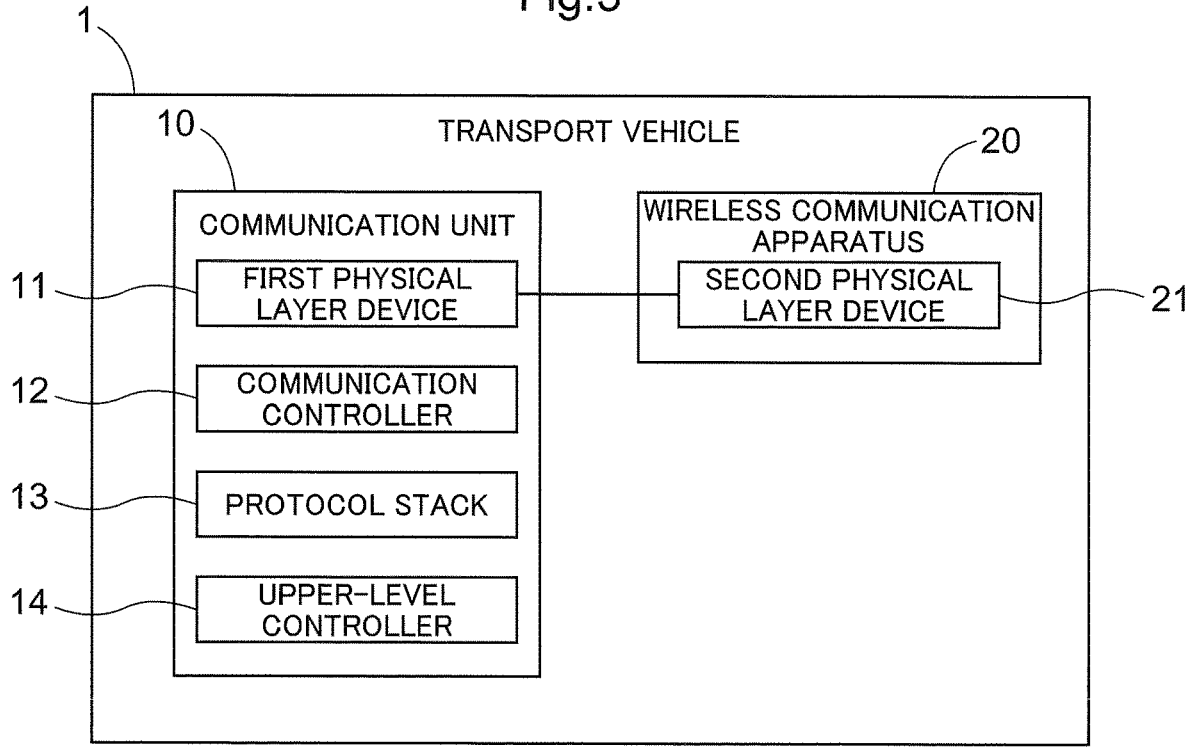
FIG. 3 is a control block diagram according to the embodiment.

As shown in FIG. 3, the transport vehicle 1 includes a wireless communication apparatus 20, and a communication unit 10 for communicating via the wireless communication apparatus 20 with an access point 30 selected from the plurality of access points 30. The wireless communication apparatus 20 functions as a wireless station for wirelessly communicating with an access point 30. By establishing a communication link with a selected access point 30 (for example, the access point 30 having the highest signal intensity), the wireless communication apparatus 20 is communicably connected to this access point 30. The wireless communication apparatus 20 includes a communication module capable of wirelessly communicating with an access point 30. The communication module is, for example, a module that performs wireless communication conforming to the wireless LAN (Local Area Network) communication standard.

The communication unit 10 includes a first physical layer device 11, a communication controller 12, a protocol stack 13, and an upper-level controller 14. The constituent elements included in the communication unit 10 are mounted on a single substrate, for example. The upper-level controller 14 controls the first physical layer device 11, the communication controller 12, and the protocol stack 13. A processor such as a CPU (Central Processing Unit) included in the upper-level controller 14 executes the protocol stack 13, which is software. Note that the constituent elements of the communication unit 10 are distinguished at least functionally or logically from each other, but are not necessarily distinguished physically from each other. For example, the first physical layer device 11 and the communication controller 12 may be integrated into a common device, instead of being individual and independent devices. Also, for example, the communication controller 12 and the upper-level controller 14 (specifically, the processor such as the CPU) may be integrated into a common device, instead of being individual and independent devices.

The first physical layer device 11 controls the connection between the communication unit 10 and the wireless communication apparatus 20. The first physical layer device 11 is communicably connected to a second physical layer device 21 included in the wireless communication apparatus 20. The first physical layer device 11 and the second physical layer device 21 are devices (chips) that execute processing in a physical layer, and perform conversion between logical signals and electric signals. Here, the first physical layer device 11 and the second physical layer device 21 are connected to each other in a wired manner (via a wired LAN cable, for example). Upon being activated, the first physical layer device 11 performs processing (link-up processing) for establishing a communication link with the second physical layer device 21. Link-up processing is auto-negotiation processing for automatically setting the communication speed and the communication mode (half duplex or full duplex), for example. In the present embodiment, the first physical layer device 11 corresponds to the "physical layer device".

The communication controller 12 controls the processing and communication of data that is transmitted and received via the first physical layer device 11. The communication controller 12 is a device (chip) that executes processing in a data link layer, and is connected to the first physical layer device 11 via a not-shown data bus. By processing and transmitting/receiving a packet, the communication controller 12 controls the processing and communication of data that is transmitted and received via the first physical layer device 11. The communication controller 12 is realized by, for example, a LAN controller (specifically, a wired LAN controller).

The protocol stack 13 includes a communication protocol for communication performed via the communication network 40. The communication protocol included in the protocol stack 13 is, for example, TCP (Transmission Control Protocol) or a UDP (User Datagram Protocol). The protocol stack 13 outputs an instruction for transmitting data in accordance with the communication protocol to the communication controller 12. Also, the protocol stack 13 converts the data received by the communication controller 12 via the first physical layer device 11, and gives the converted data to an application.

Identification information relating to the transport vehicle 1 is used for communication between the transport vehicle 1 and the control device 50. In the present embodiment, the identification information is an IP (Internet Protocol) address. The identification information (here, an IP address) relating to the transport vehicle 1 is stored in the protocol stack 13 of the communication unit 10 provided in the transport vehicle 1. As described above, the communication network 40 includes the first network segment 41 and the second network segment 42. A network segment refers to a unit for network separated by a network address. Therefore, an IP address based on which communication with an access point 30 belonging to the first network segment 41 is possible differs from an IP address based on which communication with an access point 30 belonging to the second network segment 42 is possible, and different IP addresses are assigned to the transport vehicle 1 between the first network segment 41 and the second network segment 42.

While the transport vehicle 1 is traveling, hand-over (hand-off) is made for switching access points 30 with which the wireless communication apparatus 20 provided in the transport vehicle 1 is to establish a communication link. If such hand-over is made between access points 30 belonging to the same network segment (in FIG. 2, the travel of the transport vehicle 1 with such hand-over is indicated by a first arrow M1), the IP address of the transport vehicle 1 will not be changed. Therefore, the upper-level controller 14 performs hand-over between the access points 30 belonging to the same network segment, while maintaining all of the first physical layer device 11, the communication controller 12, and the protocol stack 13 in an active state.

On the other hand, if hand-over is made between access points 30 belonging to different network segments (in FIG. 2, the travel of the transport vehicle 1 with such hand-over is indicated by a second arrow M2), the IP address of the transport vehicle 1 will be changed. In the present embodiment, hand-over between access points 30 belonging to different network segments includes first switching and second switching. Here, the first switching refers to switching from a first state in which the transport vehicle 1 is connected to an access point 30 in the first access point group 31 to a second state in which the transport vehicle 1 is connected to an access point 30 in the second access point group 32. Also, the second switching refers to switching from the second state to the first state. In the present embodiment, the first switching and the second switching are performed when the transport vehicle 1 travels on the connecting route 63 to move from one of the first building 71 and the second building 72 to the other (see FIG. 1).

If the first physical layer device 11 is restarted (reset) during the hand-over between access points 30 belonging to different network segments, the communication link between the first physical layer device 11 and the second physical layer device 21 will be disconnected. Therefore, processing (link-up processing) for reestablishing the communication link between the first physical layer device 11 and the second physical layer device 21 is needed, and the link-up processing typically requires a certain amount of time. As a result, it takes longer time for hand-over, and there is a risk that traffic jam of the transport vehicles 1 may occur on the connecting route 63, for example.

In view of this point, in the article transport facility 100 of the present disclosure, during the first switching or the second switching (in the present embodiment, both the first switching and the second switching), the upper-level controller 14 executes network segment switching processing of restarting the communication controller 12 and the protocol stack 13 while maintaining the first physical layer device 11 in an active state. That is to say, when performing hand-over between access points 30 belonging to different network segments, the upper-level controller 14 executes the network segment switching processing. Here, an access point 30 to which the transport vehicle 1 (specifically, the wireless communication apparatus 20) was connected before the execution of the hand-over is referred to as a "before-switching access point", and an access point 30 to which the transport vehicle 1 (specifically, the wireless communication apparatus 20) is to be connected after the execution of the hand-over is referred to as a "after-switching access point".

In the network segment switching processing, by restarting the communication controller 12, it is possible to appropriately delete communication data with the before-switching access point to initialize the communication controller 12, and by restarting the protocol stack 13, it is possible to appropriately switch the IP address of the transport vehicle 1 to an IP address based on which the transport vehicle 1 can communicate with the after-switching access point. The restarting the communication controller 12 and the restarting the protocol stack 13 do not involve processing that requires a relative long period of time, such as the above-described link-up processing. On the other hand, since, in the network segment switching processing, the first physical layer device 11 remains active (that is, the communication link between the first physical layer device 11 and the second physical layer device 21 is maintained), there is no need to perform link-up processing that is required when the first physical layer device 11 is restarted, making it possible to reduce the time required for the hand-over. This enables, even if the movement of the transport vehicle 1 involves the hand-over between access points 30 belonging to different network segments, to avoid an incommunicable state between the control device 50 and the transport vehicle 1 from continuing for a long period of time, suppressing a decrease in efficiency of transport of the article 2 due to the hand-over.

Note that, here, an example has been described in which the first access point group 31 is constituted by a plurality of access points 30 installed in the first building 71, and the second access point group 32 is constituted by a plurality of access points 30 installed in the second building 72, but the present invention is not limited to this example. For example, when the article transport facility 100 is configured to perform inter-floor transport in which the article 2 is transported between different floors in the same building, the first access point group 31 may be constituted by a plurality of access points 30 installed in the first floor, and the second access point group 32 may be constituted by a plurality of access points 30 installed in the second floor (different from the first floor). In this case, the transport vehicle 1 is lifted and lowered by, for example, a lifting apparatus to move between the travel route 60 arranged in the first floor and the travel route 60 arranged in the second floor.

The embodiment disclosed in the present specification is merely an example in all respects, and various modifications are possible as appropriate, without departing from the spirit of the present disclosure.

Overview of the Embodiments

Hereinafter, the overview of the article transport vehicle explained above will be described.

An article transport facility includes: a transport vehicle configured to travel along a predetermined travel route to transport an article; a control device configured to control the transport vehicle; and a communication facility configured to communicably connect the transport vehicle and the control device, wherein the communication facility includes: a plurality of access points for wireless communication installed in such a manner as to be communicable with the transport vehicle; and a communication network configured to connect the plurality of access points to each other, with a first access point group being a group of first access points among the plurality of access points, and a second access point group being a group of second access points different from the first access points, the communication network includes: a first network segment configured to connect the first access points constituting the first access point group to each other; and a second network segment configured to connect the second access points constituting the second access point group to each other, the transport vehicle includes: a wireless communication apparatus; and a communication unit configured to communicate via the wireless communication apparatus with an access point selected from the plurality of access points, the communication unit includes: a physical layer device configured to control a connection established with the wireless communication apparatus; a communication controller configured to control processing and communication of data transmitted and received via the physical layer device; a protocol stack including a communication protocol for communication performed via the communication network; and an upper-level controller configured to control the physical layer device, the communication controller, and the protocol stack, and during (i) a switch from a first state in which the transport vehicle is connected to a first access point in the first access point group to a second state in which the transport vehicle is connected to a second access point in the second access point group, or (ii) a switch from the second state to the first state, the upper-level controller executes network segment switching processing including restarting the communication controller and the protocol stack, while maintaining the physical layer device in an active state.

According to the configuration, during (i) a switch from a first state in which the transport vehicle is connected to an access point in the first access point group (in other words, an access point belonging to the first network segment) to a second state in which the transport vehicle is connected to an access point in the second access point group (in other words, an access point belonging to the second network segment), or (ii) a switch from the second state to the first state, the network segment switching processing is performed. That is to say, in the present configuration, the network segment switching processing is performed when hand-over is made between access points belonging to different network segments. Here, an access point with which the transport vehicle was connected before the execution of the hand-over is referred to as a "before-switching access point", and an access point to which the transport vehicle is to be connected after the execution of the hand-over is referred to as a "after-switching access point".

Also, according to the present configuration, in the network segment switching processing, the communication controller and the protocol stack are restarted while the physical layer device remains active. With this, since the communication controller and the protocol stack are restarted in the network segment switching processing, hand-over can be made appropriately. Specifically, by restarting the communication controller, it is possible to appropriately delete communication data with the before-switching access point to initialize the communication controller, and by restarting the protocol stack, it is possible to appropriately switch identification information of the transport vehicle to identification information (such as an IP address) based on which the transport vehicle can communicate with the after-switching access point. On the other hand, since the physical layer device remains active in the network segment switching processing, there is no need to perform processing for reestablishing a communication link between the physical layer device and the wireless communication apparatus (specifically, a physical layer device of the wireless communication apparatus), which is required when the physical layer device is restarted, and thus it is possible to reduce the time required for the hand-over.

Thus, according to the configuration, it is possible to reduce the time required for hand-over between access points belonging to different network segments. Also, as the time can be reduced, it is possible, even if the movement of the transport vehicle involves the hand-over between access points belonging to different network segments, to avoid an incommunicable state between the control device and the transport vehicle from continuing for a long period of time, suppressing a decrease in efficiency of article transport due to the hand-over.

Here, preferably, the control device includes: a first communication server; and a second communication server, the first network segment is configured to connect the first communication server and the first access points constituting the first access point group, and the second network segment is configured to connect the second communication server and the second access points constituting the second access point group.

According to the configuration, in a first state in which the transport vehicle is connected to an access point belonging to the first network segment, the transport vehicle can be communicably connected to the first communication server, and in a second state in which the transport vehicle is connected to an access point belonging to the second network segment, the transport vehicle can be communicably connected to the second communication server. Thus, according to the article transport facility of the present disclosure, as the time can be reduced that is required for hand-over between access points belonging to different network segments, it is possible to avoid an incommunicable state between the transport vehicle, and the first communication server or the second communication server from continuing for a long period of time.

It is sufficient for the article transport facility according to the present disclosure to be able to realize at least one of the above-described effects.

What is claimed is:
1. An article transport facility, comprising:
a transport vehicle configured to travel along a predetermined travel route to transport an article;

a control device configured to control the transport vehicle; and a communication facility configured to communicably connect the transport vehicle and the control device, wherein the communication facility comprises:

a plurality of access points for wireless communication installed in such a manner as to be communicable with the transport vehicle; and a communication network configured to connect the plurality of access points to each other, and wherein:

a first access point group is a group of first access points among the plurality of access points, and a second access point group is a group of second access points different from the first access points, the communication network comprises:

a first network segment configured to connect the first access points constituting the first access point group to each other; and a second network segment configured to connect the second access points constituting the second access point group to each other, the transport vehicle comprises:

a wireless communication apparatus; and a communication unit configured to communicate via the wireless communication apparatus with an access point selected from the plurality of access points, the communication unit comprises:

a physical layer device configured to control a connection established with the wireless communication apparatus;

a communication controller configured to control processing and communication of data transmitted and received via the physical layer device;

a protocol stack including a communication protocol for communication performed via the communication network; and an upper-level controller configured to control the physical layer device, the communication controller, and the protocol stack, and during (i) a switch from a first state in which the transport vehicle is connected to a first access point in the first access point group to a second state in which the transport vehicle is connected to a second access point in the second access point group, or (ii) a switch from the second state to the first state, the upper-level controller executes network segment switching processing including restarting the communication controller and the protocol stack, while maintaining the physical layer device in an active state.

2. The article transport facility according to claim 1, wherein:

the control device comprises:

a first communication server; and a second communication server, the first network segment is configured to connect the first communication server and the first access points constituting the first access point group, and the second network segment is configured to connect the second communication server and the second access points constituting the second access point group.

* * * * *